United States Patent [19]

Toda et al.

[11] Patent Number: 4,975,633

[45] Date of Patent: Dec. 4, 1990

[54] SPECTRUM ANALYZER HAVING MEANS FOR DISPLAYING SPECTRUM DATA TOGETHER WITH POWER VALUE THEREOF

[75] Inventors: Hiromichi Toda, Ebina; Kenji Tanaka, Hadano, both of Japan

[73] Assignee: Anritsu Corporation, Tokyo, Japan

[21] Appl. No.: 332,959

[22] Filed: Apr. 3, 1989

[30] Foreign Application Priority Data

Apr. 11, 1988 [JP] Japan .................................. 63-88734
Mar. 22, 1989 [JP] Japan .................................. 1-69819

[51] Int. Cl.$^5$ .......................................... G01R 23/16
[52] U.S. Cl. ................................. 324/77 B; 364/485
[58] Field of Search ............... 324/77 B, 77 C, 77 CS, 324/77 K, 78 E, 78 D; 364/483, 484, 485

[56] References Cited

U.S. PATENT DOCUMENTS

| | | | |
|---|---|---|---|
| 3,466,431 | 9/1969 | Fuchs et al. | 324/77 B |
| 3,937,899 | 2/1976 | Denenberg | 364/485 |
| 3,992,666 | 11/1976 | Edwards et al. | 324/77 B |
| 4,321,680 | 3/1982 | Bertrand et al. | 324/77 B |
| 4,607,215 | 8/1986 | Takano et al. | 324/77 B |

FOREIGN PATENT DOCUMENTS 2033689 8/1979 United Kingdom .
0805191 2/1981 U.S.S.R. .................. 364/485

OTHER PUBLICATIONS

"L'Analyseur de Spectres: Un Outil Indispensable," from Mesures, Mar. 1979.
"L'analyseur de spectre en radio-téléphonie," by A. Fabregue, in Toute l'Electronique, Apr. 1984.

Primary Examiner—Jerry W. Myracle
Assistant Examiner—Louis M. Arana
Attorney, Agent, or Firm—Frishauf, Holtz, Goodman & Woodward

[57] ABSTRACT

A directing section substantially directs an input signal to first and second paths. A signal processing section outputs spectrum data corresponding to the input signal directed to the first path. A power detecting section detects a power value corresponding to the input signal directed to the second path. A display section displays the power value together with spectrum data.

15 Claims, 6 Drawing Sheets

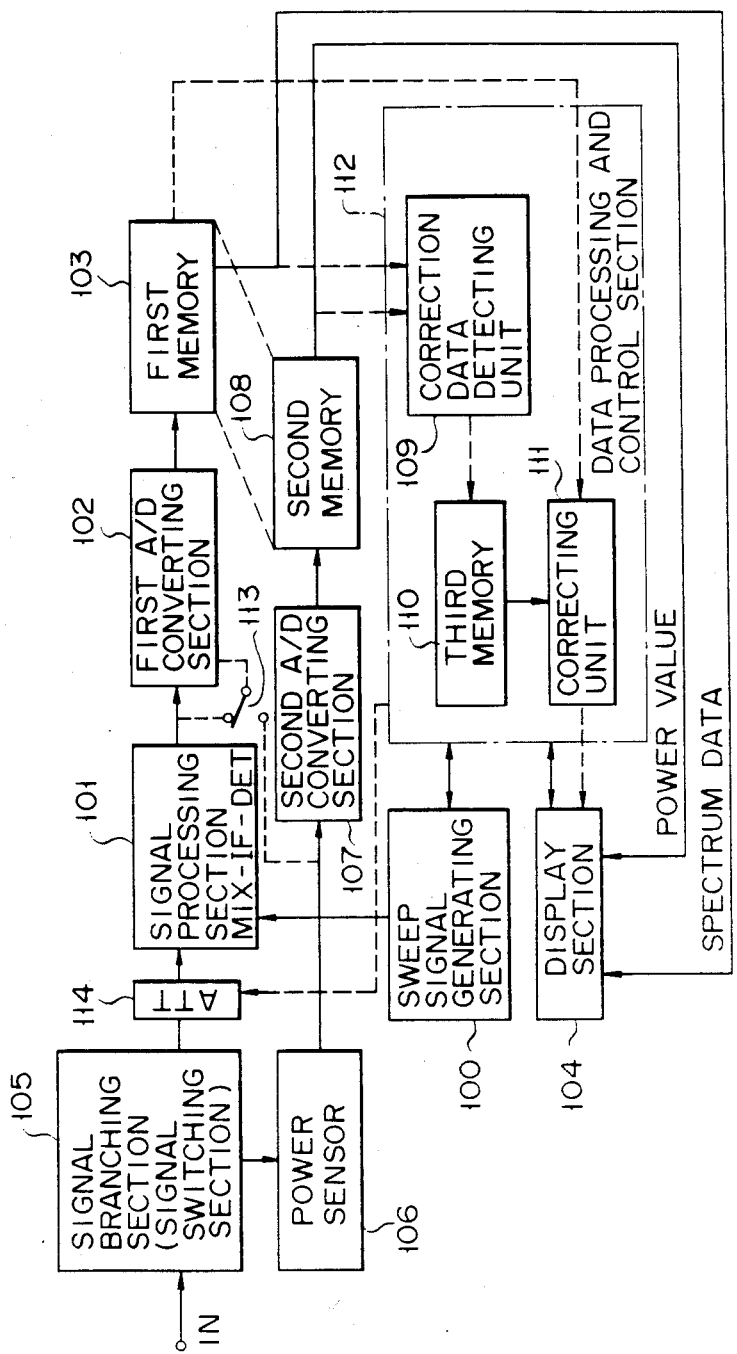
F I G. 1

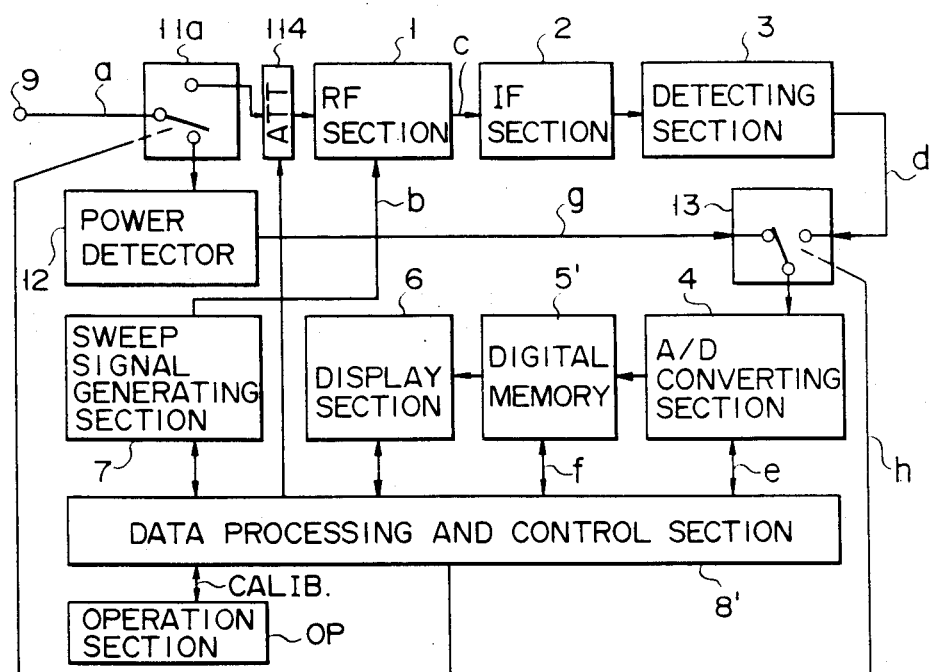
F I G. 5
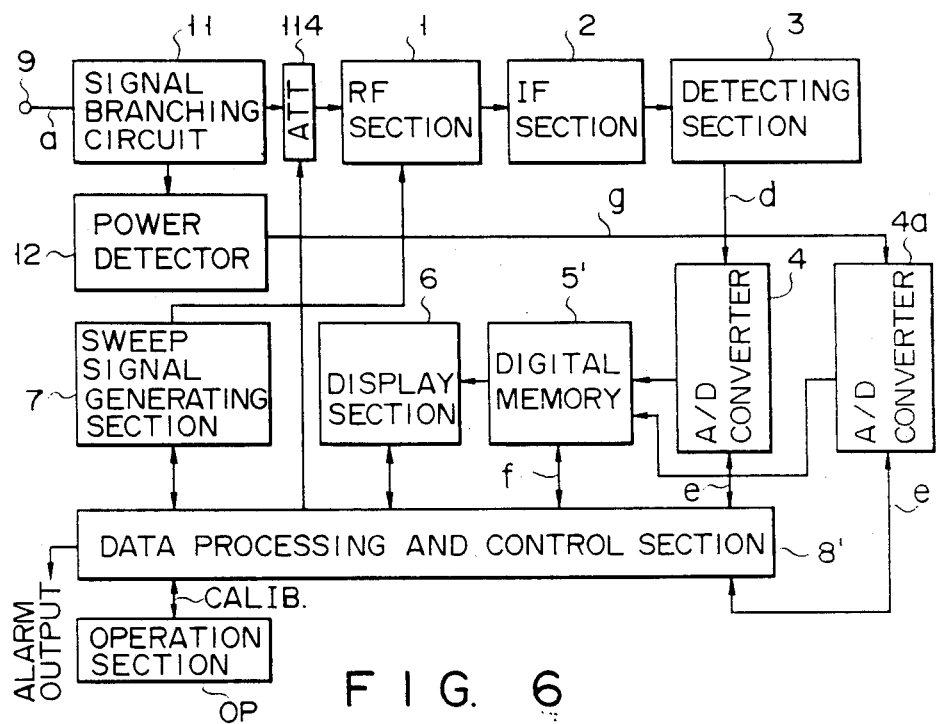
F I G. 6

SPECTRUM ANALYZER HAVING MEANS FOR DISPLAYING SPECTRUM DATA TOGETHER WITH POWER VALUE THEREOF

BACKGROUND OF THE INVENTION

1. Field of the Invention

This invention relates to a spectrum analyzer and, more particularly, to an improvement of a spectrum analyzer for analyzing an RF frequency or optical signal.

2. Description of the Related Art

As is well known, a spectrum analyzer measures the characteristics of a high-frequency signal within a relatively wide range; for example, within several tens of kHz to several hundred GHz, and displays the spectrum intensity at each frequency on a CRT display section, as a function of frequency. As is shown in FIG. 10, such a spectrum analyzer includes, for example, an RF section (high-frequency circuit) 1, an IF section (intermediate-frequency circuit) 2, a detecting section 3, an A/D converting section 4, a digital memory 5, a CRT display section 6, a sweep signal generating section 7, a data processing and control section 8, and the like.

With the above circuit arrangement, a high-frequency input signal to-be-measured a, input from an input terminal 9, is input to the RF section 1 consisting of a mixer and a local oscillator. In the RF section 1, the input signal a is mixed with a local signal whose frequency is changed in accordance with the signal level of a sweep signal b output from the sweep signal generating section 7. Thus, the signal a is frequency-converted into an intermediate-frequency signal c which is output from the RF section 1 and input to the IF section 2 which incorporates a bandpass filter (BPF). Only a frequency component which coincides with the pass frequency of the bandpass filter passes through the IF section 2, is input to the detecting section 3, and output as a DC detection signal d corresponding in strength to the magnitude of the input frequency component. The detection signal d is then converted into digital data by the A/D converting section 4, in response to the period of a sampling signal e output from the data processing and control section 8 consisting of, for example, a microprocessor. Thereafter, the converted data is stored in the digital memory 5 consisting of, for example, a RAM.

In response to a read signal f output at a predetermined period from the data procesing and control section 8, digital data of the detection signal d for each sampling period, stored in the digital memory 5, is read out in a predetermined order, and supplied to the display section 6. The display section 6 includes an image memory for one frame which can be displayed on a display screen at one time. After sequentially input data values are stored in the image memory, image data read out from the image memory for one frame is displayed on the display screen. Thus, spectrum distribution data is displayed on the display screen of the display section 6, as shown in FIG. 11.

Each spectrum shown in FIG. 11 has an ideal linear shape. However, each spectrum having a width corresponding to a bandwidth of the bandpass filter in the IF section 2 is actually displayed.

The above-mentioned data processing and control section 8 controls the sweep interval and sweep speed of the sweep signal generating section 7, outputs the sampling signal e to the A/D converting section 4, and outputs the read signal f to the digital memory 5, so that spectrum distribution data as shown in FIG. 11 is displayed on the display section 6. In addition, the data processing and control section 8 executes a calculation required for display, on the display section 6, of the spectrum value corresponding to the desired frequency value.

The spectrum analyzer having the above arrangement shown in FIG. 10 has, however, the following problems. In order to examine the characteristics of signal a, accurate distribution data relating to the spectrum values at every frequency contained in the signal a must be obtained, and the total value of the spectrum values, i.e., the power value of the input signal to be measured a must be simultaneously obtained, in many cases.

When the input signal a contains spectrum components distributed over the bandwidth of the bandpass filter in the IF section 2, its power value is measured, as follows, using the conventional spectrum analyzer as shown in FIG. 10. Data values obtained for every period of the sampling signal e in the A/D converting section 4 during a period from the start to the finish of one sweep signal b can be integrated by, for example, the data processing and control section 8. Accurate integration of the power value of the input signal a is based on the assumption that the spectrum values within the entire frequency range of signal a are accurately measured. However, it is generally difficult to predict in advance the distribution of the spectrum components contained in the input signal to be measured. In addition, as described above, when a deviation of the spectrum to be measured, corresponding to the bandwidth of the bandpass filter in the IF section 2, is corrected and the integration is performed, complicated correcting calculation is required. Therefore, it is practically impossible to accurately measure the power value by the above integration method.

In such a spectrum analyzer, only signal components within the specific frequency sweep range selected and set by the data processing and control section 8 are displayed on the display section 6. Actually, high-level spectrum values (frequency components) are often present in a frequency region outside the frequency sweep range. Thus, an operator is often unaware of the high-level frequency components. In addition, saturation in the RF section 1 is neglected, and many measurement errors may be caused. Furthermore, the RF section 1 may be damaged due to excessive input. In particular, when a signal such as a noise signal and an RF pulse signal wherein spectra are distributed in a wide range is measured, the power value and pulse peak power are further increased as compared with each spectrum value. Therefore, the above-mentioned problems tend to occur.

Even if all the spectra are present in the pass band of the bandpass filter in the IF section 2, as in the case of continuous-wave (CW) signal and the power value can be measured in principle, a considerable error is usually generated because the signal to be measured passes through the complicated signal circuits 7 in the RF and IF sections 1 and 2. Therefore, in an attempt to accurately measure the power value of the continuous-wave signal, a signal having well-known accurate power value is input in advance as a reference signal, and an indication value of the spectrum analyzer is calibrated for the frequency to be used. However, the calibration process is quite time-consuming and the efficiency of measurement operation is considerably degraded. In practice, it is almost impossible always to provide a signal source having a well-known accurate power value at a measurement frequency, and the power value must be measured with an insufficient measurement precision.

SUMMARY OF THE INVENTION

It is, therefore, an object of the present invention to provide a new and improved spectrum analyzer which distributes a signal to-be-measured between a signal processing section and a power detector through a signal branching section, in order to obtain an accurate reading of the power value of the signal, for display together with the usual spectrum distribution data.

According to one example of the present invention, there is provided a spectrum analyzer comprising:

directing means for substantially directing an input signal to a first path and a second path;

data-producing means for producing spectrum data corresponding to the input signal directed to the first path by the directing means;

sensing means for sensing a power value corresponding to the input signal directed to the second path by the directing means; and display means for displaying the spectrum data produced by the data-producing means, together with a power value sensed by the sensing means.

The spectrum analyzer according to the above example is able to obtain an accurate power value, for display together with the usual spectrum distribution data, without the measuring time being increased.

The spectrum analyzer according to another example of the present invention, comprises:

an RF section for mixing a signal to-be-measured input from an input terminal, with a local oscillation signal frequency-swept in response to a sweep signal from a sweep signal generating section, and frequency-converting the mixed signal;

an IF section for extracting a predetermined frequency component of an output signal from the RF section;

a detecting section for detecting an output signal from the IF section; an A/D converting section for converting a detection signal from the detecting section into a digital value, at a predetermined period;

a CRT display section for displaying each digital value converted by the A/D converting section as a spectrum value at each frequency;

a signal branching circuit located between the input terminal and the RF section; and a power detector for detecting the power value of the signal to-be-measured branched by the signal branching circuit and supplying the power value to the display section in order to display the power value together with the spectrum value.

In the spectrum analyzer having the above arrangement, the signal to-be-measured, input to the input terminal, is input to the RF section and to the power detector through the signal branching circuit. The signal to-be-measured input to the RF section is converted into a spectrum value corresponding to each frequency by the RF section, the IF section, the detecting section, and the A/D converting section, and is displayed on the display section.

On the other hand, the power value of the signal to-be-measured input to the power detector is detected as a mean value or a peak value by the power detector. The detected power value is then displayed on the display section, together with each spectrum value.

A spectrum value at each frequency and the power value of the signal to be measured are displayed on the CRT display section at the same time.

A spectrum analyzer according to still another example of the present invention, comprises:

a signal processing section for processing a signal to-be-measured, input from an input terminal, in response to a sweep signal, and outputting a signal corresponding to a spectrum of the signal to-be-measured;

a first A/D converting section, for converting the corresponding signal into first digital data;

a first memory, for storing the first digital data;

a signal branching/switching circuit located between the input terminal and the signal processing section;

a power sensor for detecting the power of the signal to-be-measured output from the signal branching/switching circuit;

a second A/D converting section, for converting an output from the power sensor into second digital data;

a second memory, for storing an output from the second A/D converting section; and a display section for displaying the second digital data together with the first digital data.

BRIEF DESCRIPTION OF THE DRAWINGS

These and other objects and features of the present invention can be understood through the following embodiments, by reference to the accompanying drawings, of which:

FIG. 1 is a block diagram showing a schematic general arrangement of a spectrum analyzer according to the present invention;

FIGS. 5 and 6 are block diagrams showing a spectrum analyzer according to second and third embodiments of the present invention, respectively;

DETAILED DESCRIPTION OF THE PREFERRED EMBODIMENTS

Figure 2:
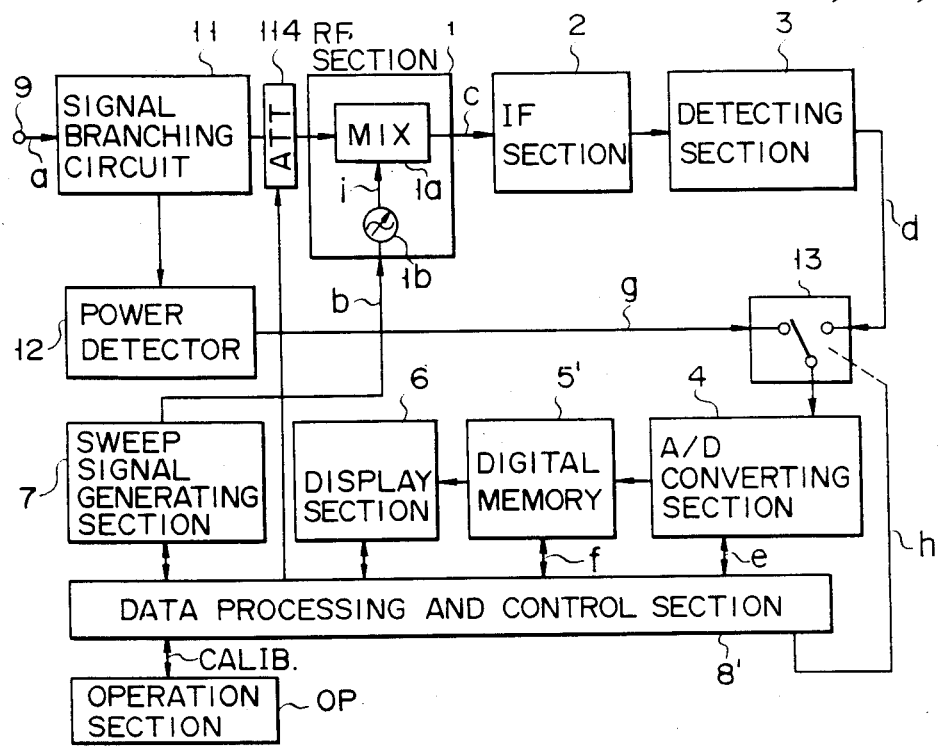
FIG. 2 is a block diagram showing a spectrum analyzer according to a first embodiment of the present invention.

A general description the present invention will be now be presented, prior to more detailed ones of the preferred embodiments thereof. As shown in FIG. 1, the present invention pertains to a spectrum analyzer comprising a signal processing section 101 for processing a signal to-be-measured input from an input terminal IN in response to a sweep signal input from a sweep signal generating section 100, and outputting a signal corresponding to the spectrum of the signal to-be-measured, a first A/D converting section 102 for converting the corresponding signal into first digital data, a first memory 103 for storing the first digital data, and a display section 104 for displaying the first digital data.

According to the present invention, there is provided a spectrum analyzer comprising a power sensor 106 for detecting the power of the signal to-be-measured input through a signal branching circuit (or a signal switching circuit) 105 located between the input terminal IN and the signal processing section 101, a second A/D converting section 107 for converting an output from the power sensor 106 into second digital data, a second memory 108 for storing an output from the second A/D converting section 107, and having a specific arrangement characterized in that the second digital data is displayed on the screen of the display section 104 together with the first digital data.

According to the present invention, in addition to the above-mentioned specific arrangement, there is provided a spectrum analyzer comprising a correction data detecting unit 109 for detecting, as correction data, a difference between the first digital data stored in the first memory 103 and the second digital data stored in the second memory 108, a third memory 110 for storing correction data, which represents the difference between the first and second digital data detected by the correction data detecting unit 109, and a correcting unit 111 for correcting the first digital data stored in the first memory on the basis of the correction data, and displaying the resultant corrected data on the display section 104. Referring to FIG. 1, the correction data detecting unit 109, the third memory 110, and the correcting unit 111 are arranged in a data processing and control section 112 similar to that shown in FIG. 10.

According to the present invention, there is provided, in addition to the above-mentioned specific arrangement, a spectrum analyzer comprising a common A/D converting section 102 provided as the first and second A/D converting sections 102 and 107, and a switching section 113 for switching and supplying a signal from the power sensor 106 to the common A/D converting section 102 so as to control the switching section 113 in synchronism with a sweep period and a reset period of the sweep signal. The first and second memories, 103 and 108, should, incidently, be understood as being individual memory areas within a single memory.

According to the present invention, there is additionally provided a spectrum analyzer comprising a variable attenuator 114, arranged between the signal branching circuit 105 and the signal processing section 101, for varying an input level to control the attenuation value of the attenuator to be a desired value, on the basis of the second digital data. In this way, an excessive input level can be reduced to a proper level.

Embodiments of the present invention based on the above general description will now be described hereinafter, with reference to the accompanying drawings.

FIG. 2 is a block diagram showing a schematic arrangement of a spectrum analyzer according to a first embodiment. The same reference numerals in FIG. 2 denote the same parts as in the conventional spectrum analyzer shown in FIG. 10. In this embodiment, a signal branching circuit 11 is arranged between an input terminal 9 and an RF section 1 including a mixer 1a and a local oscillator 1b. The RF section 1 is connected to one output terminal of the signal branching circuit 11, through the variable attenuator 114 and a power detector 12 is connected to the other output terminal thereof. The signal branching circuit 11 consists of a resistive power divider, for example, and distributes a signal to-be-measured a input from the input terminal 9 to the RF section 1 and the power detector 12, at a power distribution ratio (e.g., 1:1) determined earlier in accordance with a voltage division ratio of the resistor.

The power detector 12 consists of a normal high-frequency power detector employing a thermocouple element, a diode element, an averaging circuit, and the like, or a power detector utilizing a wide-band amorphous power sensor technique. The power detector 12 can accurately detect the power value of a signal within a wide range of DC frequency to high frequency. As the latter amorphous power sensor, a power detector described in U.S. patent application No. 216,909, and EPC application No. 87906936.7 filed or assigned by the present applicant or assignee, can be used. A DC power value signal g output from the power detector 12 is input to an A/D converting section 4 via a switching circuit 13. The switching circuit 13 receives a detection signal d output from a detecting section 3. The switching circuit 13 switches to supply the detection signal d or the power value signal g to the A/D converting section in response to a switching signal h output from a data processing and control section 8'.

A digital memory 5' has first and second memory areas corresponding to the first and second memories 103 and 108 shown in FIG. 1.

Figure 10:
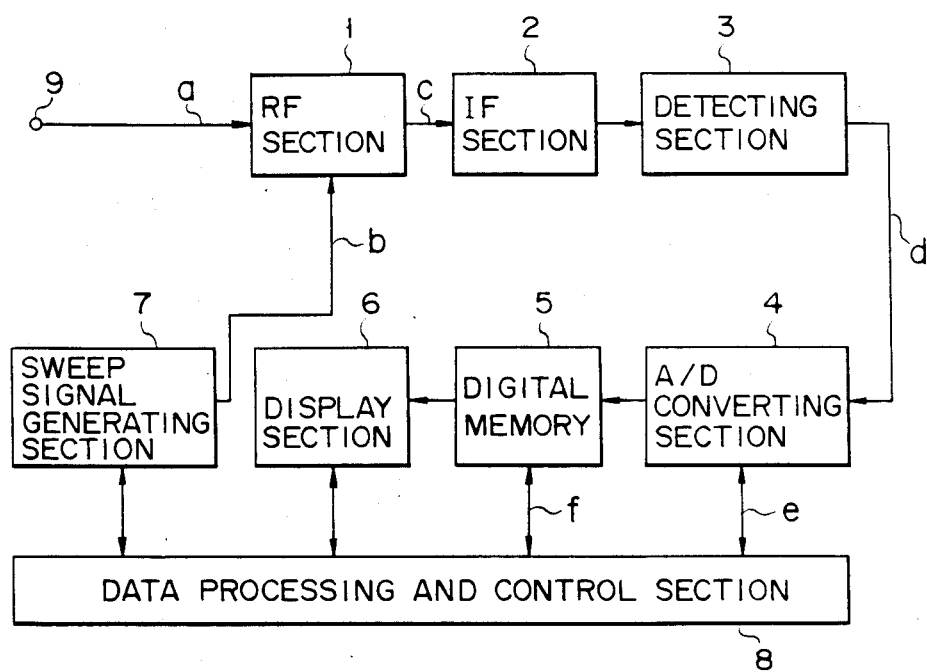
FIG. 10 is a block diagram showing a conventional spectrum analyzer.
Figure 11:
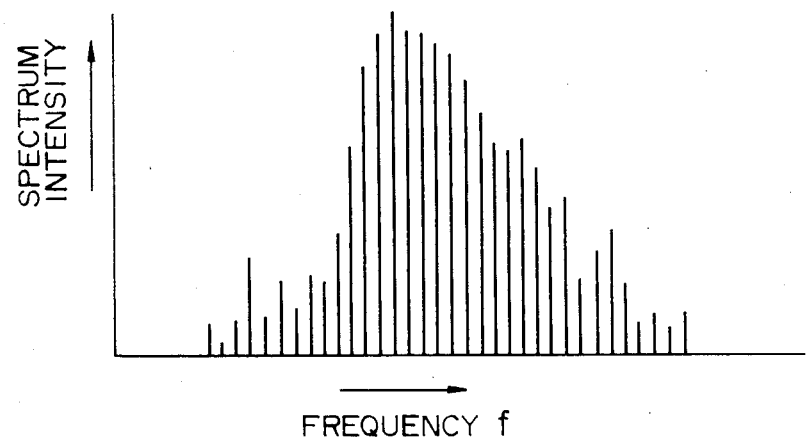
FIG. 11 is a graph showing general spectrum distribution data displayed on a display section.

The arrangement of the RF section 1, IF section 2, detecting section 3, A/D converting section 4, display section 6, and sweep signal generating section 7 as shown in the embodiment of FIG. 2 is the same as that shown in FIG. 10. However, as will be described later, the control for each unit of the data processing and control section 8' shown in FIG. 2 differs from that of FIG. 10.

A variable attenuator 114 which is the same as that shown in FIG. 1 is controlled by the data processing and control section 8'.

Figure 3:
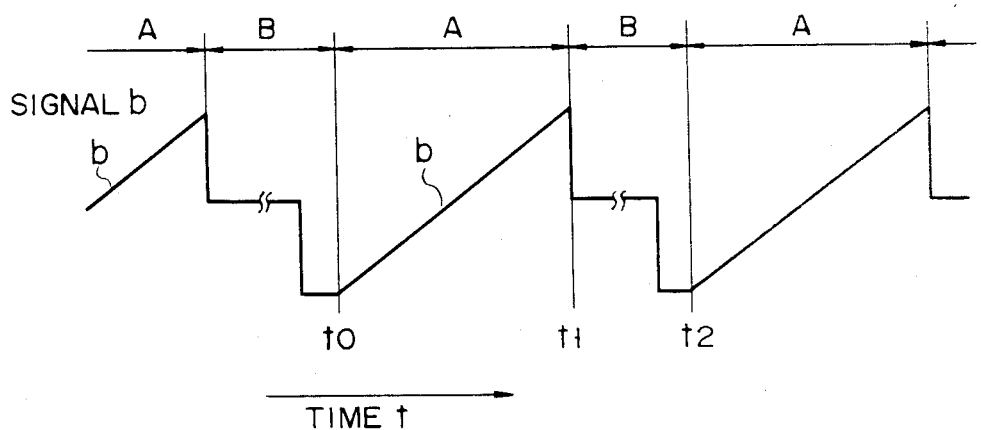
FIG. 3 is a timing chart showing an operation performed by the spectrum analyzer according to the first embodiment.

The operation of the spectrum analyzer having the above arrangement will now be described below, with reference to a timing chart of a general sweep signal b output from the sweep signal generating section 7, as shown in FIG. 3. Specifically, at time t0, the sweep signal b for sweeping the frequency of a local oscillation signal i, output from the local oscillator 1b in the RF section 1, starts an increase from a minimum value corresponding to the minimum measurement frequency. After a sweeping period A has elapsed, i.e., at time t1, and the signal b reaches a maximum value corresponding to the maximum measurement frequency, the signal level is decreased. After a reset period B has elapsed, i.e., at time t2, the signal b starts sweeping in the next sweeping period A from the minimum value corresponding to the original minimum measurement frequency.

During the sweeping period A, the data processing and control section 8' outputs the switching signal h to the switching circuit 13, to supply the detection signal d to the A/D converting section 4, whereas during the reset period B, section 8' outputs signal h to circuit 13, to supply the power value signal g to section 4.

Thus, during the sweeping period A, the high-frequency signal to-be-measured a is input from the input terminal 9 to the mixer 1a in the RF section 1, is mixed with the local oscillation signal frequency-swept in response to the sweep signal b, and the resultant mixed signal is converted into an intermediate-frequency signal c. In the IF circuit 2, only a frequency component of the signal c output from the RF section 1, which coincides with the pass frequency of a bandpass filter (BPF) is extracted to be input to the detecting section 3, where it is converted into a DC detection signal d corresponding in strength to its magnitude, and input to the A/D converting section 4 via the switching circuit 13, is converted into digital data in accordance with a period of a sampling signal e output from the data processing and control section 8' by the A/D converting section 4, and stored in the first memory area of the digital memory 5'.

Figure 4:
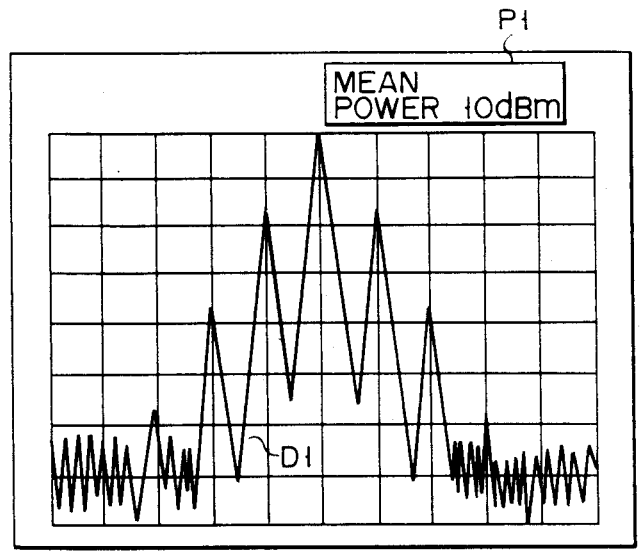
FIG. 4 is a view illustrating a display screen incorporated in the first embodiment.

In response to a read signal f output from the data processing and control section 8' at a predetermined period, the digital data for every sampling period of the detection signal d, stored in the first memory area of the digital memory 5', are read out in a predetermined order, and supplied to the display section 6. As a result, as is shown in FIG. 4, the spectrum value at each frequency, i.e., spectrum distribution data D1, is displayed on the display section 6. Note that this spectrum distribution data is held until the next reset period B ends.

During the reset period B, the power value signal output from the power detector 12 is converted to a digital value by the A/D converting section 4 via the switching circuit 13, and the digital value is stored in a second memory area in the digital memory 5', provided as an exclusive storing region of the power value. Thereafter, the value is read out from the digital memory 5', and displayed in an empty area of the above-mentioned spectrum distribution data in the CRT display section 6 as a mean power value Pl, in a numerical value character data form, as shown in FIG. 4. The numerical value character data of the power value is held until the next sweeping period A ends.

In this manner, the spectrum distribution data and the power value are displayed on a single screen of the display section 6, as shown in FIG. 4. The signal branching circuit 11 and the power detector 12 are arranged so that a spectrum value at each frequency and a total power value of the signal to-be-measured a can be obtained at the same time.

As described above, the signal branching circuit 11 and the power detector 12 of the present invention are simple in arrangement, and thus can be manufactured at low cost. In addition, they can have wide-range frequency characteristics. Therefore, a considerable increase in manufacturing cost can be suppressed, as compared with the conventional spectrum analyzer shown in FIG. 10.

The measurement precision of the spectrum analyzer according to the present invention can be greatly improved as compared with the case wherein spectrum values are added to calculate the power value.

In the first embodiment, shown in FIG. 2, the power value is measured by utilizing the reset period B of the sweep signal b. Therefore, upon the measurement of the power value, the total measuring time is not prolonged as compared with the conventional spectrum analyzer for obtaining only spectrum distribution data. In other words, the power value can also be measured within the conventional measuring time.

FIG. 5 is a block diagram showing a spectrum analyzer according to a second embodiment of the present invention. The reference numerals in FIG. 5 denote the same parts as in the first embodiment shown in FIG. 2.

In the second embodiment, an RF (high-frequency) switching circuit 11a is used as a signal branching circuit located between an input terminal 9 and an RF section 1. In response to a switching signal h output from a data processing and control section 8', the RF switching circuit 11a can switch whether a signal to-be-measured a, input from the input terminal 9, is supplied to the RF section 1 or to the power detector 12. This switching timing is synchronized with that of the switching circuit 13.

More specifically, in a sweeping period A of a sweep signal b shown in FIG. 3, the data processing and control section 8' switches the RF switching circuit 11a to the RF section 1 side and switches the switching circuit 13 to the detection signal d side by the switching signal h. During the reset period B, the data processing and control section 8' similarly switches the RF switching circuit 11a to the power detector 12 side, and the switching circuit 13 to the power value signal g side.

Each spectrum value is measured during the sweeping period A, and the power value is measured during the reset period B. Therefore, in the second embodiment, the spectrum distribution data and power value of the signal to-be-measured a can both be measured at the same time, and displayed on a single screen of the display section 6. As a result, the same effect as in the first embodiment can be obtained.

By using the RF switching circuit 11a as the signal branching circuit, the loss of the signal to-be-measured can be suppressed as compared with other signal branching circuits employing the above-mentioned resistive power divider or a directional coupler. As a result, a reduction in sensitivity of the entire spectrum analyzer caused by insertion of the signal branching circuit can be prevented.

FIG. 6 is a block diagram showing a spectrum analyzer according to a third embodiment of the present invention. The reference numerals in FIG. 6 denote the same parts as in FIG. 2.

In the third embodiment, a switching circuit 13 in FIG. 2 is eliminated, and a detection signal d output from a detecting section 3 is directly input to an A/D converter 4. In addition, a power value signal g output from a power detector 12 is input to another A/D converter, 4a. Digital data obtained by the A/D converters 4 and 4a are written in first and second memory areas in a digital memory 5', respectively. It should be noted that although, in this embodiment, the same sampling signal e is input to the A/D converters 4 and 4a, it always need not be the same sampling signal e.

With the above arrangement, the spectrum distribution data and the power value of the signal to be measured a also can be obtained. Therefore, the same effect as in the first embodiment in FIG. 2 can be obtained.

In the third embodiment, since the detection signal d and the power value signal g are converted into digital data values by means of exclusive A/D converters 4 and 4a, respectively, the power value also can be measured during the sweeping period A as shown in FIG. 3. Therefore, even if the sweeping period A for measuring the spectrum is long, the power value of the input signal to be measured a can be monitored on the display screen of the display section 6 in real time. Thus, the power value of the signal to-be-measured a can be monitored not only during the reset period B, but also during sweeping period A, i.e., the power value can always be monitored. Therefore, when an overpower is input, an alarm output is immediately generated to produce an alarm display or an alarm sound. In addition, in the same manner as in FIG. 2, the power value signal a can be utilized to automatically adjust an attenuation level of an input attenuator 114 located at a previous portion of the RF section 1 and obtain a correct display value. In other words, this spectrum analyzer can be free from damage due to an excessive signal input.

In the above embodiments shown in FIGS. 2, 5, and 6, in accordance with a specific operation (calibration command CALIB) of an operation section OP, the data value can be calibrated by the data processing and control section 8' in order to display a correct data value obtained from the signal to-be-measured a on the display section 6, by using a calibration signal for which an accurate relationship between the detection signal d and the power value g is obtained in advance. Note that, in this case, when a continuous-wave (CW) signal is used as the calibration signal, its power value need not be known in advance.

In this case, the data processing and control section 840 can perform calibration (correction) using the correction data detecting unit 109, the third memory 110, and the correcting unit 111 shown in FIG. 1.

Figure 7:
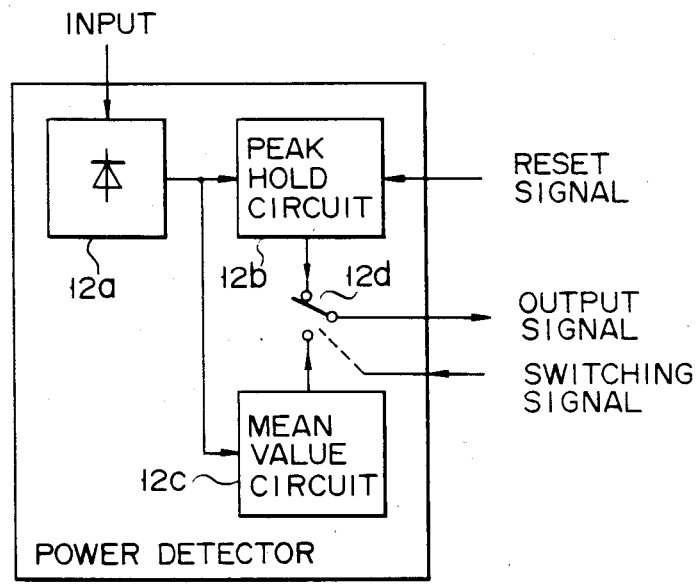
FIG. 7 is a block diagram showing a typical power detector used in the above embodiments.

The above description is based on the assumption that an arrangement for detecting a mean value is employed, as the power detector 12. However, in particular, when a peak power need be detected in the measurement of the spectrum of a modulated pulse, a diode element 12a for detecting an input signal from the signal branching circuit 11 or the signal switching circuit 11a, and a peak hold circuit 12b for holding a peak value of the detected output of the diode element 12a may be arranged as the power detector 12, as shown in FIG. 7. The peak hold circuit 12b receives a reset signal from the data processing and control section 8' upon every measuring periods. Note that a mean value circuit 12c is arranged in the power detector 12 shown in FIG. 7 to obtain a mean value of the detected outputs from the diode element 12a. In addition, the power detector 12 includes a switch 12d for switching outputs from the mean value circuit 12c and the peak hold circuit 12b in accordance with applications.

Figure 8:
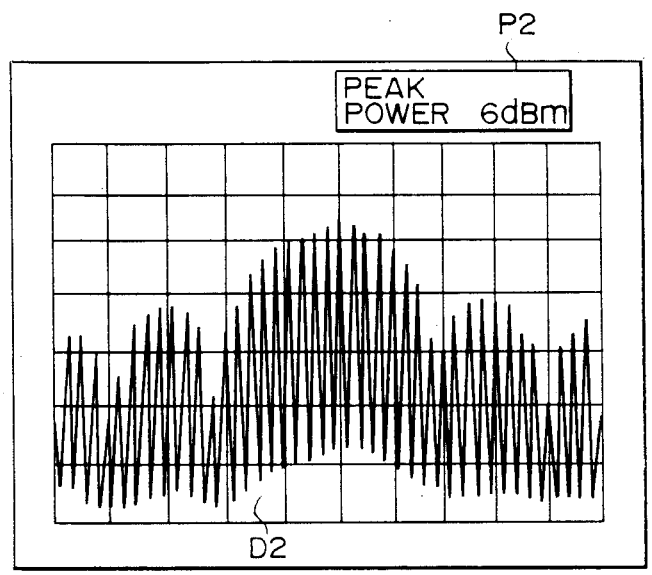
FIG. 8 is a view illustrating a display screen in a case using the power detector in FIG. 7.

FIG. 8 shows an example of display of the spectrum distribution data D2 and the peak value P2 of a modulated pulse.

Figure 9:
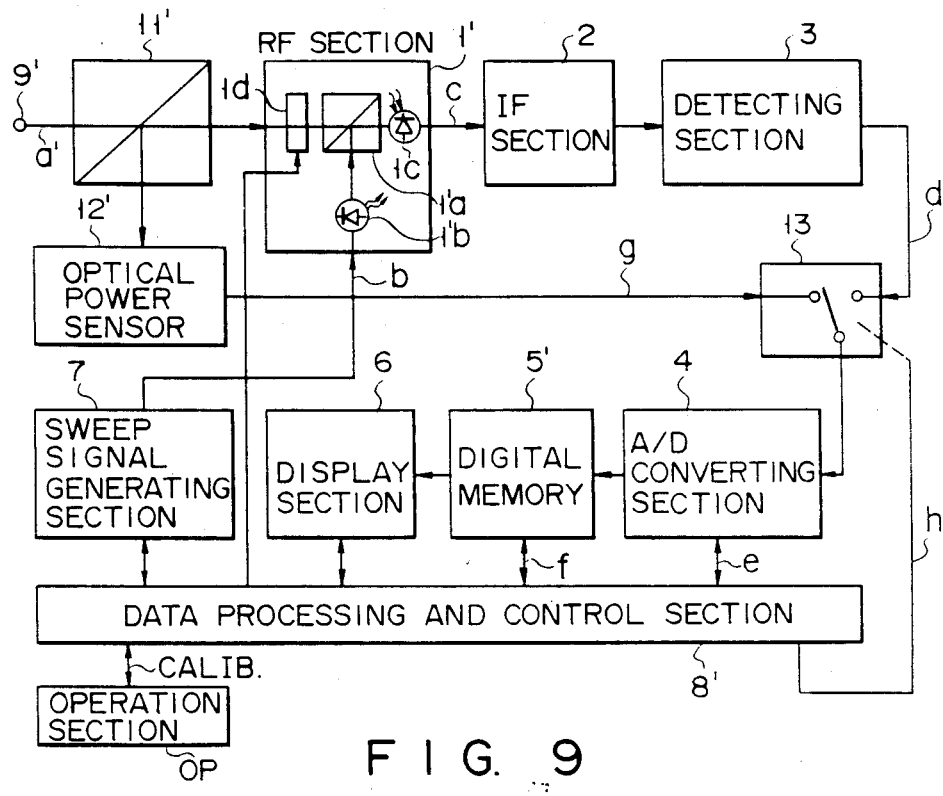
FIG. 9 is a block diagram showing an optical spectrum analyzer according to a fourth embodiment of the present invention.

FIG. 9 shows a block arrangement applied to an optical spectrum analyzer, as a fourth embodiment. The same reference numerals in FIG. 9 denote the same parts as in FIG. 2, and a description thereof is omitted. More specifically, an optical signal to be measured a' input to an optical signal input terminal 9' is branched into two signals by an optical signal branching section 11' including, e.g., a half mirror. One optical signal is input to a half mirror 1a' of an RF section 1'. The half mirror 1a' receives an optical local oscillation signal from an electrooptical converter 1b' of, e.g., a light-emitting diode in response to an optical sweep signal from a sweep signal generating section 7. Therefore, the half mirror 1a' performs a mixer operation equal to that of an electrical mixer to output an optical intermediate-frequency signal. The optical intermediate-frequency signal is converted into an electrical intermediate-frequency signal by a photoelectric converter 1c such as a photodiode. Therefore, the following steps are the same as those in FIG. 2.

The other optical signal from the optical signal branching section 11' is photoelectrically converted by an optical power sensor 12' including a light-receiving element such as a photodiode. At the same time, the optical power of the optical signal is detected. Therefore, the following steps are the same as those in FIG. 2 except that an optical power value signal g in FIG. 9 replaces the power value signal g in FIG. 2.

According to the fourth embodiment, therefore, the optical spectrum distribution data and the optical power value are displayed on a single screen in the same manner as in FIGS. 4 and 8.

In FIGS. 5 to 7, an application to the optical spectrum analyzer can be performed in the same manner as in the fourth embodiment in FIG. 9.

Note that reference numeral 1d in FIG. 9 denotes a programmable optical attenuator controlled by a data processing and control section 8. The optical attenuator 1d suppresses an excessive input level to be a proper level in the same manner as in the variable attenuator 114 in FIG. 1.

As has been described above, according to the present invention, a signal to be measured is distributed to a signal processing section and a power detector through a signal branching section. Therefore, there is provided a spectrum analyzer which can easily and accurately display normal spectrum distribution data together with a power value, and can be applied to a wide range of signals including an electrical signal and an optical signal.

What is claimed is:

1. A spectrum analyzer comprising:
    direction means for substantially directing an input signal to a first path and a second path;
    data-producing means for producing spectrum data corresponding to the input signal directed to the first path by said directing means;
    sensing means for sensing a power value corresponding to the input signal directed to the second path by said directing means; and
    display means for displaying the spectrum data produced by said data-producing means, together with a power value sensed by said sensing means.

2. An analyzer according to claim 1, wherein the input signal includes an electrical signal.

3. An analyzer according to claim 1, wherein the input signal includes an optical signal.

4. An analyzer according to claim 2, wherein said directing means includes one of a signal branching circuit and a signal switching circuit.

5. An analyzer according to claim 1, wherein said data-producing means comprises:
    signal processing means for processing the input signal in response to a sweep signal, and outputting a signal corresponding to the spectrum of the input signal;
    first A/D converting means, for converting the signal corresponding to the spectrum of the input signal into first digital data; and
    first memory means, for storing the first digital data.

6. An analyzer according to claim 1, wherein said sensing means comprises means for detecting at least one of a mean power value and a peak power value.

7. An analyzer according to claim 5, wherein said sensing means comprises:
    power sensor means for detecting the power of the input signal;
    second A/D converting means, for converting an output from said power sensor means into second digital data; and second memory means, for storing the second digital data.

8. An analyzer according to claim 7, wherein said display means comprises:
a display; and
display control means for controlling the displaying of the first and second digital data from said first and second memory means on a single screen.

9. An analyzer according to claim 1, further comprising:
means for correcting the spectrum data in accordance with a difference between the spectrum data produced by said producing means and the power value sensed by said sensing means.

10. An analyzer according to claim 1, further comprising:
means for attenuating the input signal directed to the first path by said directing means, in accordance with the power value sensed by said sensing means.

11. A spectrum analyzer comprising:
a signal processing section for processing a signal to-be-measured input from an input terminal, in response to a sweep signal, and outputting a signal corresponding to the spectrum of the signal to-be-measured;
a first A/D converting section, for converting the corresponding signal into first digital data;
a first memory, for storing the first digital data;
a signal branching/switching circuit arranged between said input terminal and said signal processing section;
a power sensor for detecting the power of the signal to-be-measured output from said signal branching/switching circuit;
a second A/D converting section, for converting an output from said power sensor into second digital data;
a second memory, for storing an output from said second A/D converting section; and
a display section for displaying the second digital data together with the first digital data.

12. An analyzer according to claim 11, further comprising: detecting means for detecting a difference between the first digital data stored in said first memory and the second digital data stored in said second memory; a third memory, for storing the difference in the digital data detected by said detecting means; and correcting means for correcting the first digital data stored in said first memory, in accordance with the difference in the digital data, and displaying the corrected data on said display means.

13. An analyzer according to claim 11, further comprising: a common A/D converting section serving as said first and second A/D converting sections; switching means for switching and supplying a signal from said signal processing section or a signal from said power sensor to said common A/D converting section; and control means for controlling said switching means in synchronism with a sweeping period and a reset period of the sweep signal.

14. An analyzer according to claim 11, further comprising: a variable attenuator, arranged between said input terminal and said signal processing section, for varying a level of the signal to-be-measured; and a control section for controlling an attenuation level of said attenuator to a desired value, on the basis of the second digital data.

15. A spectrum analyzer comprising:
an RF section for mixing a signal to-be-measured and a frequency-swept local oscillation signal, and outputting a frequency-converted output signal;
an IF section for extracting a predetermined frequency component of an output signal from said RF section;
a detecting section for detecting an output signal from said IF section;
an A/D converting section for converting a detection signal from said detecting section into a digital values for a predetermined period;
a display section for displaying the digital values converted by said A/D converting section as spectrum values at corresponding frequencies;
a signal branching circuit arranged between said input terminal and said RF section; and
a power detector for detecting the power value of the signal to-be-measured branched by said signal branching circuit, and supplying the detected power value to said display section, to display the power value together with the spectrum value

* * * * *